(12) United States Patent
Lee et al.

(10) Patent No.: US 8,344,261 B2
(45) Date of Patent: Jan. 1, 2013

(54) CARRIER SUBSTRATE, FABRICATION METHOD THEREOF, PRINTED CIRCUIT BOARD USING THE SAME, AND FABRICATION METHOD THEREOF

(75) Inventors: Suk Won Lee, Gyunggi-do (KR); Keung Jin Sohn, Gyunggi-do (KR); Chang Gun Oh, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 188 days.

(21) Appl. No.: 12/805,586

(22) Filed: Aug. 6, 2010

(65) Prior Publication Data
US 2011/0155429 A1    Jun. 30, 2011

(30) Foreign Application Priority Data
Dec. 24, 2009    (KR) .................. 10-2009-0130841

(51) Int. Cl.
*H05K 1/09*     (2006.01)
*H05K 1/11*     (2006.01)
(52) U.S. Cl. ........ 174/257; 174/254; 174/266; 174/260; 361/748; 361/750; 361/762; 428/352; 428/626; 428/628; 29/830; 29/831; 29/847
(58) Field of Classification Search .......... 174/252–267; 361/748–751, 762–767, 790–795; 29/825–853; 428/416, 418, 352, 615, 628, 674; 438/106–118; 438/121–129, 611–618; 106/1.18, 38.22, 106/38.23, 38.24, 38.27; 430/314, 316, 318; 257/686, 698, 730–742
See application file for complete search history.

(56) References Cited

U.S. PATENT DOCUMENTS

| | | | | |
|---|---|---|---|---|
| 3,991,231 A | * | 11/1976 | Trausch | 430/314 |
| 4,529,477 A | * | 7/1985 | Lundberg et al. | 216/17 |
| 5,384,230 A | * | 1/1995 | Berg | 430/313 |
| 5,510,580 A | | 4/1996 | Shirai et al. | |
| 5,569,545 A | * | 10/1996 | Yokono et al. | 428/626 |
| 6,004,734 A | * | 12/1999 | Berg | 430/502 |
| 6,652,962 B1 | * | 11/2003 | Sato et al. | 428/352 |
| 7,230,188 B1 | * | 6/2007 | En et al. | 174/257 |
| 7,531,754 B2 | * | 5/2009 | Yamashita et al. | 174/254 |

(Continued)

FOREIGN PATENT DOCUMENTS

JP    2004-235323    8/2004

(Continued)

OTHER PUBLICATIONS

Korean Office Action issued May 23, 2011 in corresponding Korean Patent Application 10-2009-0130841.

*Primary Examiner* — Michail V Datskovskiy (57) ABSTRACT

Disclosed are a carrier substrate including an insulating base material with a copper foil layer formed on at least one surface thereof, a metal layer formed on the copper layer and having a length shorter than that of the copper foil layer, and an insulating layer formed on the metal layer, a fabrication method thereof, a printed circuit board (PCB) using the same, and a fabrication method thereof. Because there is no land at the via and core in the substrate, because a circuit pattern connected with the via can be formed to be finer, so the circuit pattern can be highly integrated and the substrate can become thinner. Thus, a printed circuit board (PCB) having a smaller size and reduced number of layers can be fabricated.

3 Claims, 6 Drawing Sheets

U.S. PATENT DOCUMENTS

| | | | |
|---|---|---|---|
| 2003/0226687 A1* | 12/2003 | Kataoka et al. | 174/250 |
| 2004/0211751 A1 | 10/2004 | Shuto et al. | |
| 2006/0180343 A1* | 8/2006 | Chan et al. | 174/256 |
| 2007/0266886 A1* | 11/2007 | En et al. | 106/1.18 |
| 2008/0110018 A1* | 5/2008 | Shimizu et al. | 29/831 |
| 2009/0266586 A1* | 10/2009 | Sato et al. | 174/254 |

FOREIGN PATENT DOCUMENTS

| | | |
|---|---|---|
| JP | 3811680 | 6/2006 |
| JP | 4332162 | 6/2009 |
| KR | 10-2009-0079373 | 7/2009 |
| KR | 10-0916124 | 9/2009 |

\* cited by examiner

CARRIER SUBSTRATE, FABRICATION METHOD THEREOF, PRINTED CIRCUIT BOARD USING THE SAME, AND FABRICATION METHOD THEREOF

CROSS-REFERENCE TO RELATED APPLICATIONS

This application claims the priority of Korean Patent Application No. 10-2009-0130841 filed on Dec. 24, 2009, in the Korean Intellectual Property Office, the disclosure of which is incorporated herein by reference.

BACKGROUND OF THE INVENTION

1. Field of the Invention

The present invention relates to a carrier substrate, a fabrication method thereof, a printed circuit board using the same, and a fabrication method thereof, and more particularly, to a carrier substrate without a land in a via and a core in the substrate, a fabrication method thereof, a printed circuit board using the same, and a fabrication method thereof.

2. Description of the Related Art

A printed circuit board (PCB) is used to allow the components of an electronic device to be mounted thereon and for wirings. The PCB is configured such that a thin plate made of copper or the like is attached on one surface of a phenol resin insulating plate or an epoxy resin insulating plate and is subsequently etched according to the wiring patterns of circuits (i.e., corroded so as to be removed while leaving circuits in lines) to form required circuits and a hole is formed to allow components to be attached and mounted thereon.

PCBs include a single sided PCB with wirings formed only on one side of an insulating substrate, a double-sided PCB with wirings formed on both sides of an insulating layer, and a multi-layer PCB with wirings formed on multiple layers. In the past, component elements and circuit patterns are simple to fit onto the single side PCB, but recently, as circuits have become increasingly complicated and the demands placed on a circuit having high density have grown, double-sided PCBs or multi-layer PCBs are generally used.

The multi-layer PCB is configured by alternately stacking circuit layers and insulating layers. This structure needs a via to electrically connect the inner circuit layer and the outer circuit layer through the insulating layer. The manufacturing of the multilayer PCB through a build-up process necessarily accompanies a process of forming a via hole in the insulating layer stacked on the inner circuit layer, which can be electrically connected with the outer circuit layer.

In this case, a land is necessarily formed at a portion connected with an upper circuit layer through the via hole for a stable electrical connection between the layers. The land is designed in consideration of a processing error in mechanical processing to form the via, an error of exposing facilities used for forming the upper circuit layer, and deformation of a raw material in use during a process. The deviation in the facilities, materials, and processes is unavoidable, so the designing of a land has been considered natural in order to increase productivity and a processing yield.

However, advancements in the electronic industry have promoted the development of high-integrated semiconductors and accelerated the reduction in size of electronic components, so, in line with this, PCBs on which the electronic components are to be mounted are now required to be smaller, thinner, and more highly integrated. To this end, efforts to make the wirings of PCBs finer, and to reduce the space of the via have continued, but the presence of the land restricts the high integration of PCBs. Also, a matching force of laser facilities for forming the via has been improved to enhance interlayer matching of the highly integrated substrate, and new high-matching exposure facilities have been developed to form fine circuits, but improvements of these facilities require a great deal of time and, basically, these facilities have a limitation in that they cannot completely remove a land.

SUMMARY OF THE INVENTION

An aspect of the present invention provides a carrier substrate without having a land in a via and a core in the substrate to allow for the formation of a fine circuit pattern and make the substrate thinner and having a landless via hole that can be easily connected with the circuit pattern which is connected with the via, a fabrication method thereof, a printed circuit board using the same, and a fabrication method thereof.

According to an aspect of the present invention, there is provided a method for fabricating a carrier substrate, including: providing an insulating base material with a copper foil layer formed on at least one surface thereof; stacking a metal layer having a length shorter than that of the copper foil layer on the copper foil layer; and forming an insulating layer on the metal layer.

The metal layer may be made of at least one selected from the group consisting of gold (Au), silver (Ag), zinc (Zn), palladium (Pd), ruthenium (Ru), nickel (Ni), rhodium (Rh), a lead (Pb)/tin (Sn) alloy, and a nickel (Ni)/gold (Au) alloy.

The method may further include: stacking a second copper foil layer on the insulating layer after the formation of the insulating layer.

The method may further include: compressing the insulating layer after the formation of the insulating layer.

According to another aspect of the present invention, there is provided a carrier substrate including: an insulating base material with a copper foil layer formed on at least one surface thereof; a metal layer formed on the copper layer and having a length shorter than that of the copper foil layer; and an insulating layer formed on the metal layer.

The metal layer may be made of at least one selected from the group consisting of gold (Au), silver (Ag), zinc (Zn), palladium (Pd), ruthenium (Ru), nickel (Ni), rhodium (Rh), a lead (Pb)/tin (Sn) alloy, and a nickel (Ni)/gold (Au) alloy.

The carrier substrate may further include: a second copper foil layer formed on the insulating layer.

According to another aspect of the present invention, there is provided a method for fabricating a printed circuit board (PCB), including: providing a carrier substrate including an insulating base material with a copper foil layer formed on at least one surface thereof, a metal layer formed on the copper layer and having a length shorter than that of the copper foil layer, and an insulating layer formed on the metal layer; forming a first circuit layer including a via having an upper land provided on the insulating layer and a first circuit pattern providing on a first face of the insulating layer; separating the carrier substrate and the insulating layer; and forming a second circuit layer including a second circuit pattern formed on a second face of the insulating layer, having a line width smaller than a minimum diameter of the via, and connected with the via.

The separating of the carrier substrate and the insulating layer may be performed by cutting an inner side of an end portion of the metal layer.

The via may be formed such that its diameter becomes smaller toward the second circuit pattern from the upper land.

The metal layer may be made of at least one selected from the group consisting of gold (Au), silver (Ag), zinc (Zn), palladium (Pd), ruthenium (Ru), nickel (Ni), rhodium (Rh), a lead (Pb)/tin (Sn) alloy, and a nickel (Ni)/gold (Au) alloy.

The method may further include: stacking a second copper foil layer on the insulating layer after the formation of the insulating layer.

The method may further include: compressing the insulating layer after the formation of the insulating layer.

The forming of the first circuit layer may include: forming a via hole at the insulating layer; forming a first plated seed layer on the insulating layer and the via hole; forming a first dry film pattern for the formation of the upper land and a second dry film pattern for the formation of the first circuit pattern on the first plated seed layer; and performing electroplating to form the first circuit layer.

The forming of the first and second dry film patterns may include: forming a dry film resist on the first plated seed layer; and exposing and developing the first film resist.

The method may further include: forming a first circuit pattern; removing first and second dry film patterns; and removing the first plated seed layer.

The forming of the second circuit layer may include: forming a second plated seed layer on the second face and the via; forming a third dry film pattern for the formation of the second circuit pattern on the second plated seed layer; and performing electroplating to form the second circuit pattern.

The forming of the third dry film pattern may include: forming a dry film resist on the second plated seed layer; and exposing and developing the dry film resist.

The method may further include: removing the third dry film pattern; and removing the second plated seed layer, after the formation of the second circuit pattern.

According to another aspect of the present invention, there is provided a printed circuit board (PCB) including: a first circuit layer provided on an insulating layer and comprising a via having an upper land and a first circuit pattern provided on a first face of the insulating layer; and a second circuit layer provided on a second face of the insulating layer and comprising a second circuit pattern having a line width smaller than a minimum diameter of the via, and connected with the via.

The via may have a shape such that its diameter becomes smaller toward the second circuit pattern from the upper land.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

A carrier substrate and fabrication method thereof according to an exemplary embodiment of the present invention will now be described with reference to FIGS. 1a to 1h.

Figure 1A:
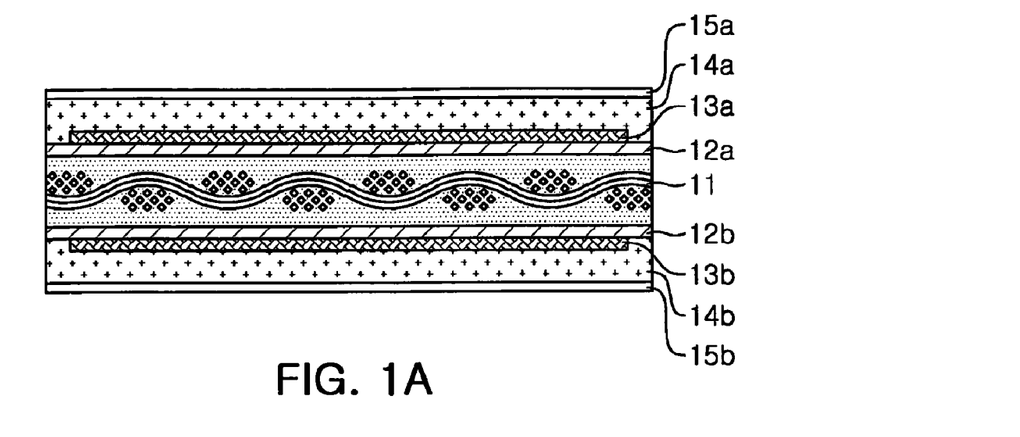
FIGS. 1a to 1d are sequential sectional views schematically showing a carrier substrate and its fabrication process according to an exemplary embodiment of the present invention.

With reference to FIG. 1a, a carrier substrate 10 according to an exemplary embodiment of the present invention includes an insulating base material 11, metal layers 13a and 13b, and insulating layers 14a and 14b.

Here, copper foil layers 12a and 12b are formed on at least one surface of the insulating base material 11.

The metal layers 13a and 13b are provided on the copper foil layers 12a and 12b, and in this case, the metal layers 13a and 13b may be made of at least one selected from the group consisting of gold (Au), silver (Ag), zinc (Zn), palladium (Pd), ruthenium (Ru), nickel (Ni), rhodium (Rh), a lead (Pb)/tin (Sn) alloy, and a nickel (Ni)/gold (Au) alloy. Here, the metal layers 13a and 13b are shorter than the copper foil layers 12a and 12b.

The insulating layers 14a and 14b are formed on the metal layers 13a and 13b, and second copper foil layers 15a and 15b are provided on the insulating layers 14a and 14b.

Figure 1B:
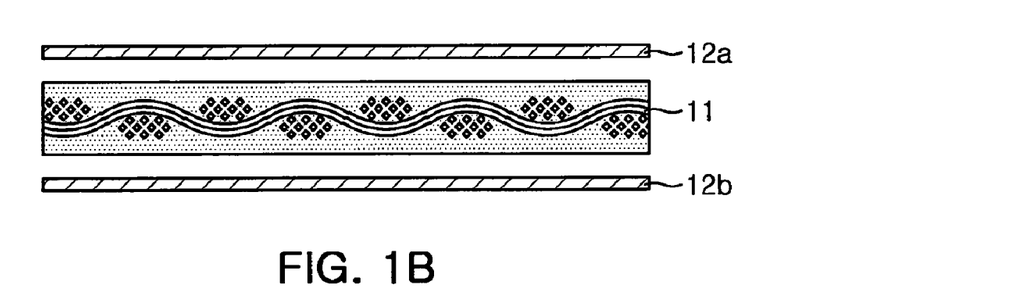

As shown in FIG. 1b, the copper foil layers 12a and 12b are formed on at least one surface of the insulating base material 11.

Figure 1C:
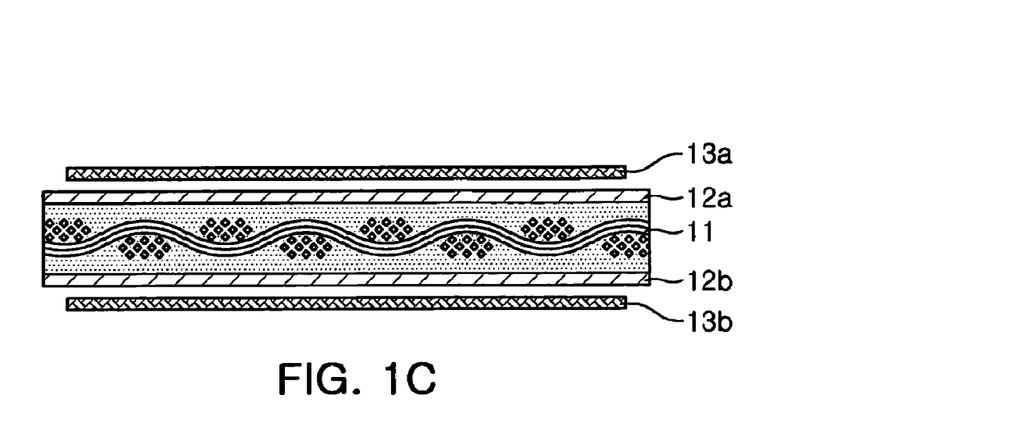

Next, as shown in FIG. 1c, the metal layers 13a and 13b are stacked on the copper foil layers 12a and 12b. Here, the metal layers 13a and 13b are formed to have a length shorter than that of the copper foil layers 12a and 12b. The metal layers 13a and 13b are formed to be shorter than the copper foil layers 12a and 12b so as to facilitate the separation of the carrier substrate 10 and the insulating layers 14a and 14b after a build-up process is performed by using the carrier substrate 10.

Figure 1D:
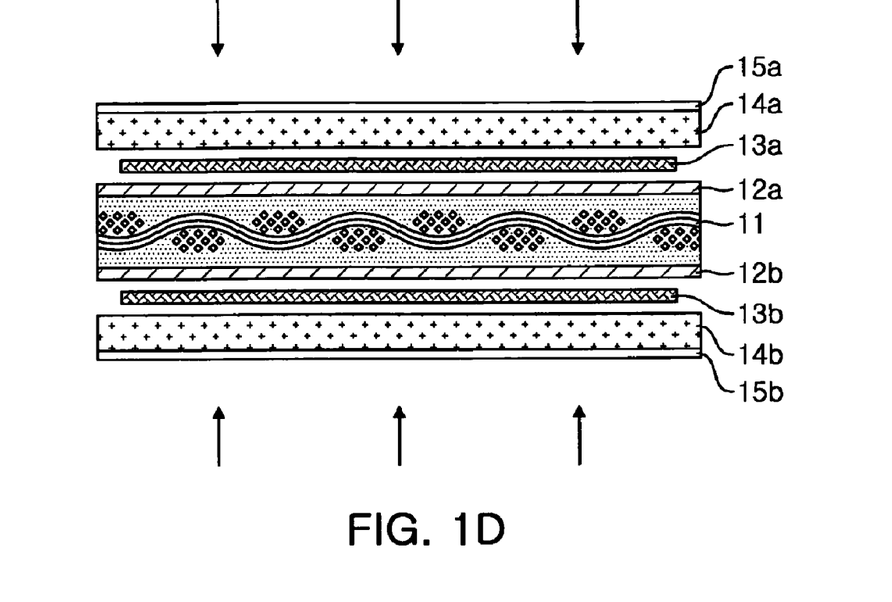

Thereafter, as shown in FIG. 1d, insulating layers 14a and 14b, as well as the second copper foil layers 15a and 15b, another group of copper foil layers, are formed on the metal layers 13a and 13b and then compressed to form the carrier substrate 10 according to an exemplary embodiment of the present invention as shown in FIG. 1a.

Here, generally, the process of compressing the insulating layers 14a and 14b is performed under the conditions of high temperature and high pressure. Thus, preferably, the compressing process is performed after the second copper foil layers 15a and 15b that can tolerate, without being deformed, the conditions of the high temperature and high pressure are formed on the insulating layers 14a and 14b.

A printed circuit board (PCB) fabricated by using the carrier substrate and its fabrication process according to an exemplary embodiment of the present invention will now be described with reference to FIGS. 2a to 2h.

Figure 2A:
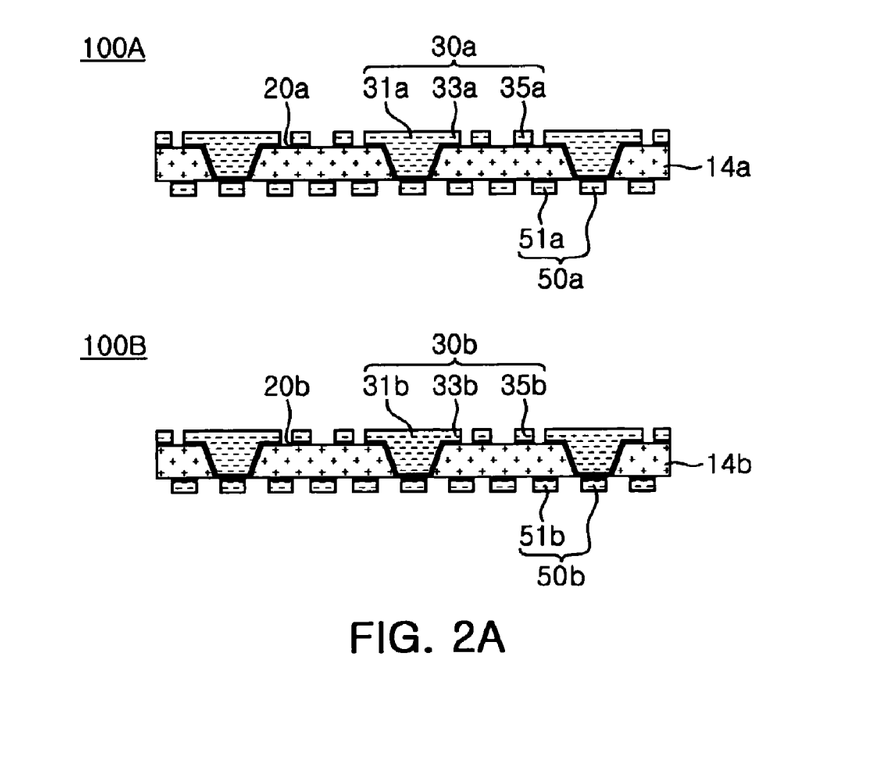
FIGS. 2a to 2g are sequential sectional views schematically showing a printed circuit board (PCB) fabricated by using the carrier substrate, and its fabrication process according to an exemplary embodiment of the present invention.

With reference to FIG. 2a, PCBs 100A and 100B according to an exemplary embodiment of the present invention include first circuit layers 30a and 30b, including vias 31a and 31b provided on the insulating layers 14a and 14b and first circuit patterns 35a and 35b provided on first faces of the insulating layers 14a and 14b, and second circuit layers 50a and 50b formed on second faces of the insulating layers 14a and 14b and including second circuit patterns 51a and 51b connected with the vias 31a and 31b.

Here, the vias 31a and 31b include upper lands 33a and 33b and have a shape whose diameter is reduced toward the second circuit patterns 51a and 51b starting from the upper lands 33a and 33b.

The second circuit patterns 51a and 51b have a line width smaller than a minimum diameter of the vias 31a and 31b and are connected with the vias 31a and 31b.

Figures 2B, 2C:
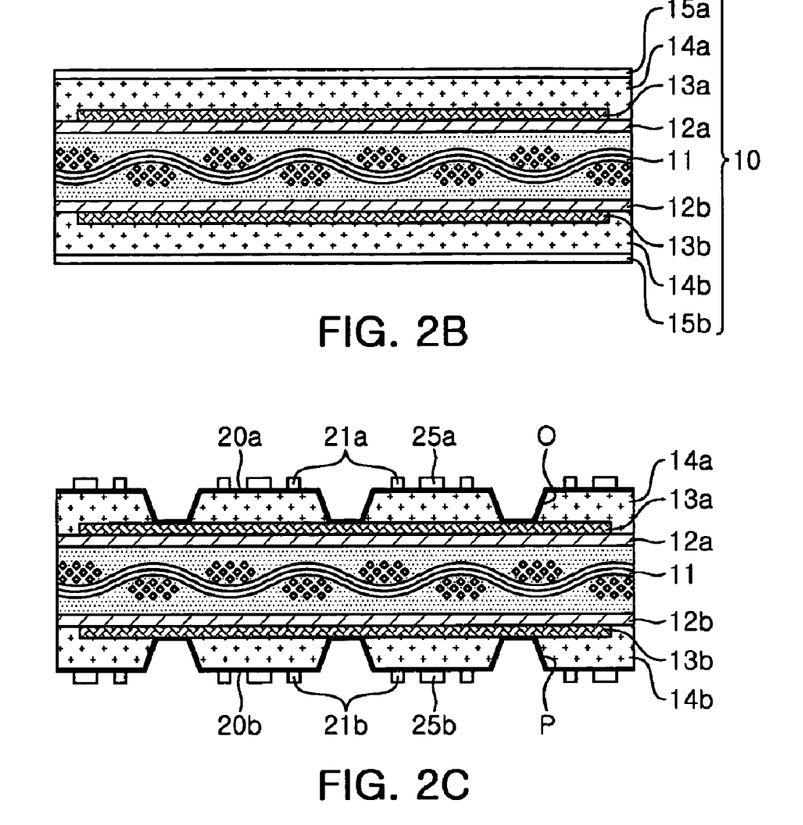

With reference to FIG. 2b, the carrier substrate 10, which includes the insulating base material 11 with the copper foil layers 12a and 12b formed on at least one surface thereof, the metal layers 13a and 13b formed on the copper foil layers 12a and 12b and have a length shorter than that of the copper foil layers 12a and 12b, and the insulating layer 14a and 14b formed on the metal layers 13a and 13b, is provided.

The metal layers 13a and 13b provided on the copper foil layers 12a and 12b may be made of at least one selected from among gold (Au), silver (Ag), zinc (Zn), palladium (Pd), ruthenium (Ru), nickel (Ni), rhodium (Rh), a lead (Pb)/tin (Sn) alloy, and a nickel (Ni)/gold (Au) alloy. Here, the metal layers 13a and 13b are shorter than the copper foil layers 12a and 12b.

The insulating layers 14a and 14b are formed on the metal layers 13a and 13b, and the second copper foil layers 15a and 15b, another group of copper foil layers, are provided on the insulating layers 14a and 14b.

With reference to FIG. 2c, after the second copper foil layers 15a and 15b formed on at least one surface of the insulating base material 11 are removed, via holes O and P are formed through the insulating layers 14a and 14b. The via holes O and P may be formed in various manners, and laser equipment is generally used for a process of forming a high density (or highly integrated) wiring. When the via holes O and P are formed by using the laser equipment, the via holes O and P generated at the insulating layers 14a and 14b to which laser is input are larger than the via holes O and P generated at the opposite insulating layers from which laser is output.

Subsequently, first plated seed layers 20a and 20b are formed on the insulating layers 14a and 14b and on the via holes O and P. Subsequently, first dry film patterns 21a and 21b to be used for forming the upper lands 33a and 33b as shown in FIG. 2d, and second dry film patterns 25a and 25b to be used for forming the first circuit patterns 35a and 35b are formed.

Here, the first dry film patterns 21a and 21b and the second dry film patterns 25a and 25b may be formed by forming a dry film resist (not shown) formed on the first plated seed layers 20a and 20b and then exposing and developing the dry film resist.

Figure 2D:
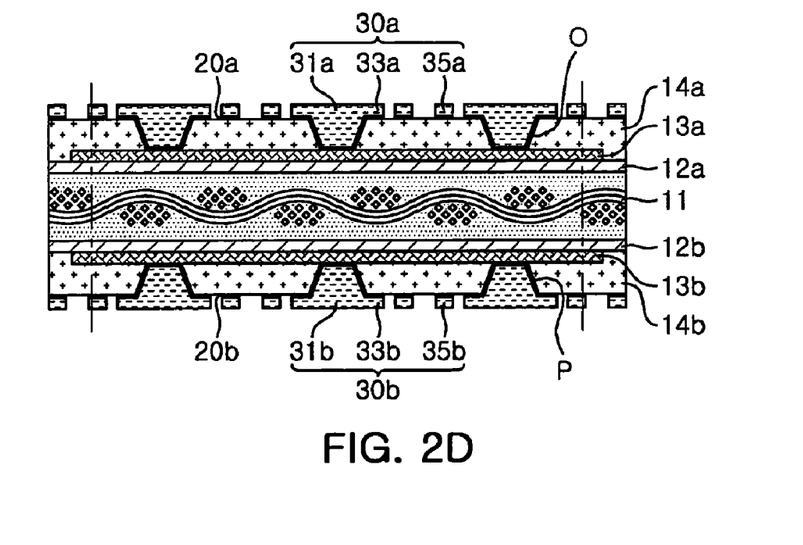

Thereafter, as shown in FIG. 2d, the first circuit layers 30a and 30b are formed on the first plated seed layers 20a and 20b through electroplating (or electrodeposition)

Here, the first plated seed layers 20a and 20b, which may be chemical copper plating layers formed through electroless plating, serve as electrodes for the first circuit layers 30a and 30b formed through electroplating afterward. Here, the first circuit layers 30a and 30b are formed through electroplating, but the method of forming the first circuit layers 30a and 30b is not limited thereto. For example, the first circuit layers 30a and 30b may be formed through electroless plating without the first plated seed layers 20a and 20b.

Here, the vias 31a and 31b include the upper lands 33a and 33b and have a shape such that their diameter diminishes toward the second circuit patterns 51a and 51b as shown in FIG. 2a, which is to be formed afterward, starting from the upper lands 33a and 33b.

After the first circuit layers 30a and 30b are formed, the first dry film patterns 21a and 21b and the second dry film patterns 25a and 25b are removed, and the first plated seed layers 20a and 20b formed at an area other than the area of the first circuit layers 30a and 30b are also removed through flash etching or the like.

Figure 2E:
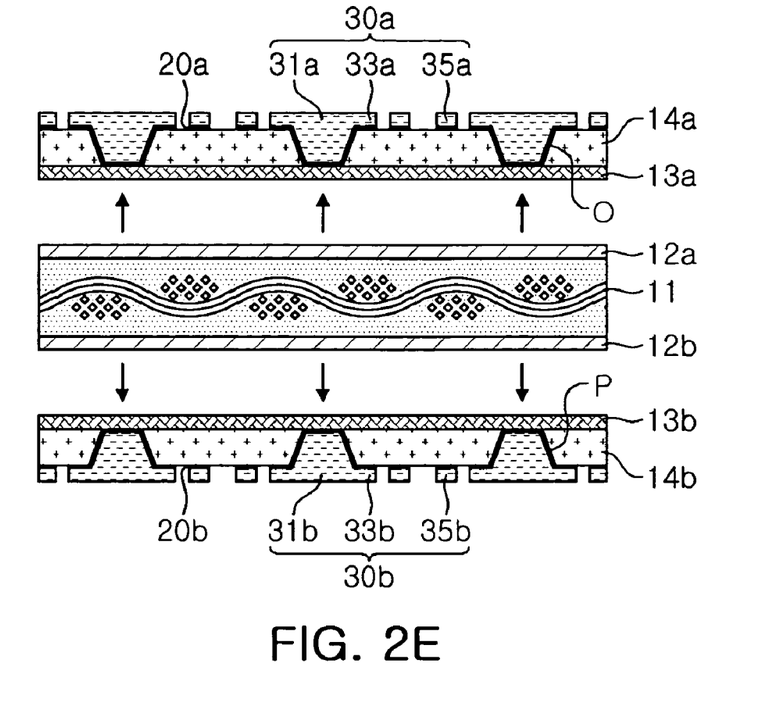

Next, the carrier substrate 10 and the insulating layers 14a and 14b are cut along a cut line in FIG. 2d. In this case, an inner side of the end portions of the metal layers 13a and 13b is cut. Because the metal layers 13a and 13b are shorter than the copper foil layers 12a and 12b, the carrier substrate 10 and the insulating layers 14a and 14b can be easily detached by cutting the inner side of the end portions of the metal layers 13a and 13b as shown in FIG. 2e.

In this manner, after the carrier substrate 10 is employed and then the core removed, thus obtaining the PCBs 100A and 100B which are thinner and smaller and have a reduced number of layers.

Figure 2F:
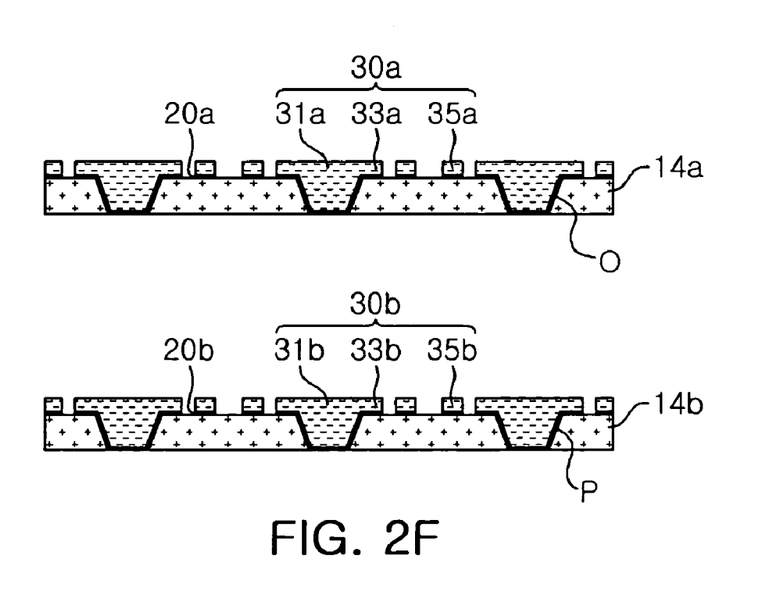

Subsequently, as shown in FIG. 2f, the metal layers 13a and 13b are removed. Here, the metal layers 13a and 13b are made of a metal different to that of the copper foil layers 12a and 12b formed on at least one surface of the insulating base material 11. Because the metal layers 13a and 13b are etched under different conditions from the etching conditions of the copper foil layers 12a and 12b, they can also serve to protect the via holes O and P.

Figure 2G:
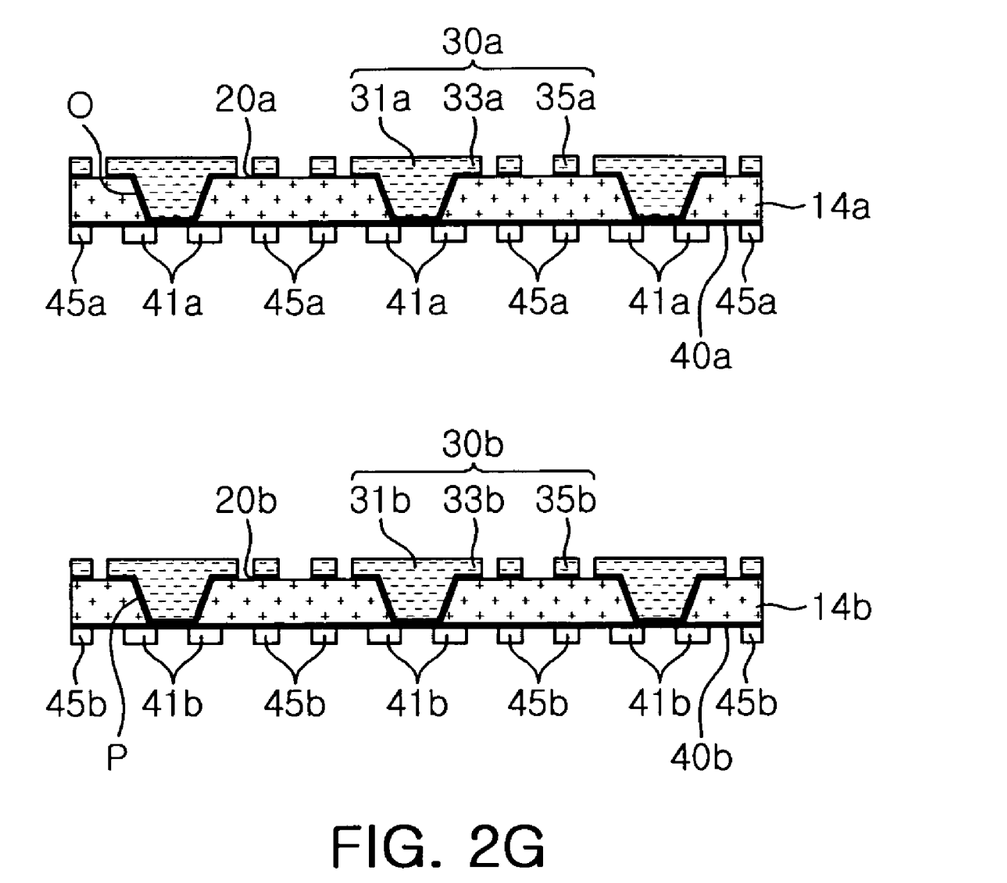

Thereafter, as shown in FIG. 2g, the second plated seed layers 40a and 40b are formed on the second face of the insulating layers 14a and 14b and on the vias 31a and 31b, from which the metal layers 13a and 13b have been removed. And then, the third dry film patterns 41a, 41b, 45a and 45b to be used for forming the second circuit patterns 51a and 51b of FIG. 2a are formed on the second plated seed layers 40a and 40b of the second face.

Here, the third dry film patterns 41a, 41b, 45a, and 45b may be formed by forming a dry film resist (not shown) on the second plated seed layers 40a and 40b and then exposing and developing the dry film resist.

Subsequently, as shown in FIG. 2a, the second circuit layers 50a and 50b are formed on the second plated seed layers 40a and 40b through electroplating. Here, the second circuit layers 50a and 50b have a line width smaller than a minimum diameter of the vias 31a and 31b, and include second circuit patterns 51a and 51b connected with the vias 31a and 31b.

Here, the second plated seed layers 40a and 40b, which may be chemical copper plating layers formed through electroless plating, serve as electrodes for the second circuit layers 50a and 50b formed through electroplating afterward. Here, the second circuit layers 50a and 50b are formed through electroplating, but the method of forming the second circuit layers 50a and 50b is not limited thereto. For example, the second circuit layers 50a and 50b may be formed through electroless plating without the second plated seed layers 40a and 40b.

After the second circuit layers 50a and 50b are formed, the third dry film patterns 41a, 41b, 45a, and 45b are removed, and the second plated seed layers 40a and 40b formed at an area other than the area of the second circuit layers 50a and 50b are also removed through flash etching or the like to complete the PCBs 100A and 100B as shown in FIG. 2a.

The advantages of removing a lower land connected with a semiconductor circuit as in the exemplary embodiment of the present invention as described above will now be described briefly with reference to FIGS. 3a and 3b.

Figure 3A:
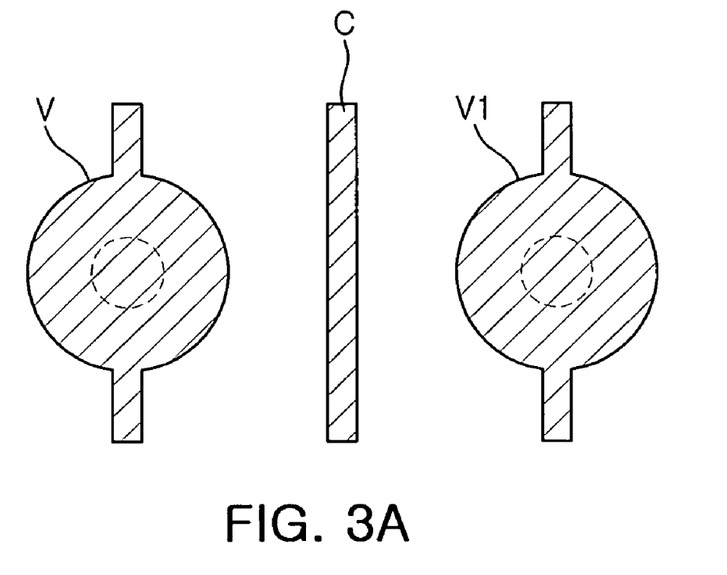
FIGS. 3a and 3b are schematic plan views for explaining the advantage of removing a lower land of the PCB according to an exemplary embodiment of the present invention.
Figure 3B:
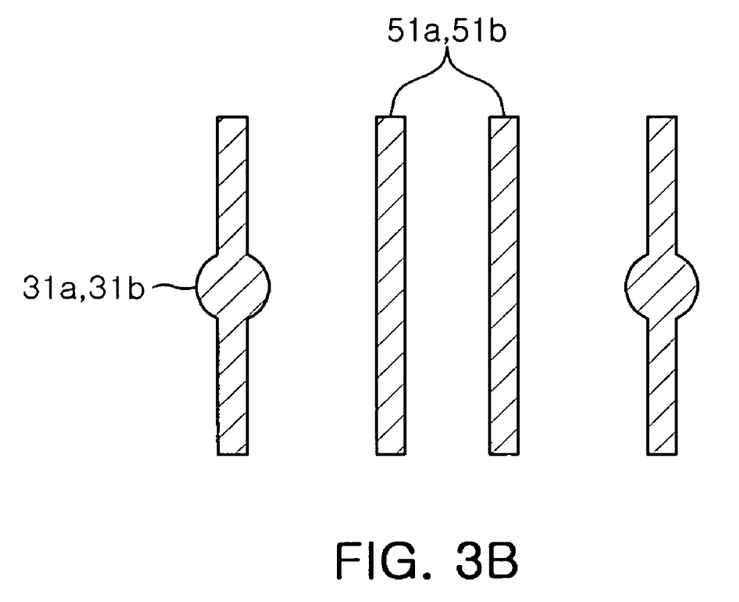

With reference to FIG. 3a, in a PCB fabricated through the related art method, when the pitch between vias V and V1 is 240 μm, only one circuit pattern (C) is allowed to be formed between the adjacent vias V and V1. In comparison, with reference to FIG. 3b, when the vias 31a and 31b are formed through the method according to the exemplary embodiment of the present invention, a circuit can be designed such that the pitch between the vias 31a and 31b is reduced in the same fine circuit and two second circuit patterns 51a and 51b are formed between the vias 31a and 31b. Accordingly, an electronic device can become compact and have a high density, and in addition, the size of the PCB can be reduced and the number of layers of the multi-layer substrate can be reduced, thus lowering the fabrication cost of the PCB.

As set forth above, according to exemplary embodiments of the invention, because there is no land at the via and core in the substrate, because a circuit pattern connected with the via can be formed to be finer, so the circuit pattern can be highly integrated and the substrate can become thinner. Thus, a printed circuit board (PCB) having a smaller size and reduced number of layers can be fabricated.

Also, because a resist layer having an opening hole matched with a via hole of the substrate is formed by using the characteristics of a electrodeposited photosensitive resist, the coreless PCB having a landless via can be fabricated through a simpler fabrication process.

While the present invention has been shown and described in connection with the exemplary embodiments, it will be apparent to those skilled in the art that modifications and variations can be made without departing from the spirit and scope of the invention as defined by the appended claims.

What is claimed is:
1. A carrier substrate comprising:
   an insulating base material with a copper foil layer formed on at least one surface thereof;
   a metal layer formed on the copper layer and having a length shorter than that of the copper foil layer; and
   an insulating layer formed on the metal layer.
2. The carrier substrate of claim 1, wherein the metal layer is made of at least one selected from the group consisting of gold (Au), silver (Ag), zinc (Zn), palladium (Pd), ruthenium (Ru), nickel (Ni), rhodium (Rh), a lead (Pb)/tin (Sn) alloy, and a nickel (Ni)/gold (Au) alloy.
3. The carrier substrate of claim 1, further comprising a second copper foil layer formed on the insulating layer.

* * * * *